(12) United States Patent
Bergman et al.

(10) Patent No.: US 9,521,748 B1
(45) Date of Patent: Dec. 13, 2016

(54) MECHANICAL MEASURES TO LIMIT STRESS AND STRAIN IN DEFORMABLE ELECTRONICS

(71) Applicant: Multek Technologies Ltd., San Jose, CA (US)

(72) Inventors: Mark Bergman, Redwood City, CA (US); Joan K. Vrtis, Mesa, AZ (US)

(73) Assignee: Multek Technologies, Ltd., San Jose, CA (US)

( * ) Notice: Subject to any disclaimer, the term of this patent is extended or adjusted under 35 U.S.C. 154(b) by 0 days.

(21) Appl. No.: 14/565,267

(22) Filed: Dec. 9, 2014

Related U.S. Application Data

(60) Provisional application No. 61/913,830, filed on Dec. 9, 2013, provisional application No. 61/916,722, filed on Dec. 16, 2013.

(51) Int. Cl.
*H05K 1/02* (2006.01)
*H05K 1/03* (2006.01)
*H05K 1/14* (2006.01)
*H05K 3/22* (2006.01)

(52) U.S. Cl.
CPC ............ *H05K 1/0393* (2013.01); *H05K 1/144* (2013.01); *H05K 1/148* (2013.01); *H05K 3/22* (2013.01); *H05K 1/028* (2013.01); *H05K 1/0278* (2013.01); *H05K 2201/0137* (2013.01); *H05K 2201/058* (2013.01)

(58) Field of Classification Search
CPC ......... H05K 1/08; H05K 1/028; H05K 1/0278
See application file for complete search history.

(56) References Cited

U.S. PATENT DOCUMENTS

| | | | | |
|---|---|---|---|---|
| 5,434,362 A | * | 7/1995 | Klosowiak | H05K 1/028 174/254 |
| 5,777,275 A | * | 7/1998 | Mizutani | H05K 1/028 174/254 |
| 5,816,848 A | | 10/1998 | Zimmerman | |
| 5,998,738 A | * | 12/1999 | Li | H05K 1/028 174/250 |
| 6,077,124 A | * | 6/2000 | Etters | H01R 12/592 439/496 |
| 6,099,745 A | * | 8/2000 | McKenney | H05K 3/062 174/254 |
| 6,292,370 B1 | * | 9/2001 | Anderson | H05K 1/0393 174/254 |

(Continued)

OTHER PUBLICATIONS

US 9,224,793, 12/2015, Son (withdrawn)*

*Primary Examiner* — Nathan Milakovich
(74) *Attorney, Agent, or Firm* — Haverstock & Owens LLP

(57) ABSTRACT

Mechanical measures strengthen a flexible circuit board or deformable electronic by manipulating the location and/or intensity of the stress concentration or to limit bending, torsion, and stretching. A material layer is patterned onto the flexible circuit board with a specific pattern and place of deposition in order to modify the stress concentration and profile of the circuit board and increase its overall strength. The material layer may be configured to modify the stress concentrations during bending away from the weak points in the assembly or to spread the stress during bending by increasing the radius of the bend curvature and therefore decreasing the chance of mechanical failure.

24 Claims, 4 Drawing Sheets

(56) References Cited

U.S. PATENT DOCUMENTS

| | | | |
|---|---|---|---|
| 6,700,074 B2 * | 3/2004 | Michel | H05K 3/0064 |
| | | | 174/254 |
| 6,743,982 B2 | 6/2004 | Biegelsen | |
| 6,921,867 B2 * | 7/2005 | Christensen | H05K 1/0271 |
| | | | 174/254 |
| 6,927,344 B1 * | 8/2005 | Gall | H05K 1/0278 |
| | | | 174/254 |
| 7,071,419 B2 * | 7/2006 | Holmes | H05K 1/028 |
| | | | 174/254 |
| 7,319,895 B2 | 1/2008 | Klefstad-Sillonville | |
| 7,491,892 B2 | 2/2009 | Wagner | |
| 7,629,691 B2 | 12/2009 | Roush | |
| 7,641,488 B2 | 1/2010 | Ho | |
| 7,643,305 B2 * | 1/2010 | Lin | H05K 1/0281 |
| | | | 361/749 |
| 7,795,540 B2 | 9/2010 | Yamada | |
| 8,188,372 B2 * | 5/2012 | Sato | H05K 3/4691 |
| | | | 174/254 |
| 8,207,473 B2 | 6/2012 | Axisa | |
| 8,294,031 B2 * | 10/2012 | Bagung | H05K 1/0278 |
| | | | 174/254 |
| 8,469,741 B2 | 6/2013 | Oster | |
| 9,018,532 B2 | 4/2015 | Wesselmann | |
| 2004/0243204 A1 | 12/2004 | Maghribi | |
| 2007/0134473 A1 * | 6/2007 | Kim | H05K 1/0281 |
| | | | 428/209 |
| 2008/0182475 A1 | 7/2008 | Gnade | |
| 2008/0223844 A1 | 9/2008 | Cronn | |
| 2009/0273460 A1 | 11/2009 | Mancosu | |
| 2010/0132981 A1 * | 6/2010 | Muro | H05K 1/0236 |
| | | | 174/250 |
| 2012/0176764 A1 | 7/2012 | Loher | |
| 2013/0160183 A1 | 6/2013 | Reho | |
| 2013/0161055 A1 | 6/2013 | Rule | |
| 2013/0256004 A1 | 10/2013 | Cotton | |
| 2014/0231793 A1 * | 8/2014 | Rajan | H05K 1/189 |
| | | | 257/40 |
| 2014/0268780 A1 * | 9/2014 | Wang | F21V 19/003 |
| | | | 362/249.06 |
| 2015/0041201 A1 | 2/2015 | Van Heck | |
| 2015/0355680 A1 * | 12/2015 | Yamazaki | G06F 1/1616 |
| | | | 361/679.27 |
| 2015/0373830 A1 * | 12/2015 | Miyagawa | H05K 1/028 |
| | | | 174/520 |
| 2016/0020500 A1 * | 1/2016 | Matsuda | H01P 3/085 |
| | | | 333/238 |
| 2016/0105950 A1 * | 4/2016 | Drzaic | B05D 3/002 |
| | | | 174/251 |
| 2016/0183363 A1 * | 6/2016 | Lee | H05K 1/0278 |
| | | | 174/254 |

* cited by examiner

MECHANICAL MEASURES TO LIMIT STRESS AND STRAIN IN DEFORMABLE ELECTRONICS

RELATED APPLICATIONS

This Patent Application claims priority under 35 U.S.C. 119(e) of the U.S. provisional patent applications, Application No. 61/913,830, filed on Dec. 9, 2013, and entitled "METAL FABRIC STITCHING AND STRETCHABLE BATTERIES," and the Application No. 61/916,722, filed on Dec. 17, 2013, and entitled "NANO-COPPER VIA FILL FOR THERMAL PLATED THROUGH HOLE APPLICATIONS," and which are also hereby incorporated by reference in their entirety.

FIELD OF THE INVENTION

The present invention is generally directed to wearable electronics. More specifically, the present invention is directed to a mechanical means for limiting stress in and strengthening deformable electronics.

BACKGROUND OF THE INVENTION

Electronic devices are increasingly being developed so as to be worn by a user, such as in wearable electronics and medical devices. As these wearable electronics gain traction in the marketplace, a new breed of devices that are able to bend, flex and stretch must be developed. These mechanical requirements present reliability challenges on mechanical components, circuit boards and other interconnects, as well as electronic components. In order to limit the stress and strain to these components while still maintaining flexibility, mechanical provisions must be put in place.

SUMMARY OF THE INVENTION

Mechanical measures strengthen a flexible circuit board or deformable electronic by manipulating the location and/or intensity of the stress concentration or to limit bending, torsion, and stretching. A material layer is patterned onto the flexible circuit board with a specific pattern and place of deposition in order to modify the stress concentration and profile of the circuit board and increase its overall strength. The material layer may be configured to modify the stress concentrations during bending away from the weak points in the assembly or to spread the stress during bending by increasing the radius of the bend curvature and therefore decreasing the chance of mechanical failure. Particularly, the mechanical measures can be used in order to strengthen and extend the life of wearable electronics as well as for in vivo and in vitro applications with wearable medical electronic devices. Additionally, the printed circuit board can be configured having a multi-layer body, one or more layers of which comprise a rigid component section and one or more layers of which comprise a flexible section including one or more coverlays comprising a polymer based film and attached throughout the circuit board for insulation and added flexibility.

In one aspect, a deformable electronic body comprising a flexible base with one or more rigid component layers and one or flexible component layers coupled to the flexible base and a material layer deposited on the body with a specific material pattern and attached at a specific location on the body in order to modify the stress concentration of the deformable electronic and increase its overall strength. In some embodiments, the pattern of the material layer and the placement of the material layer modifies the stress concentration away from the weak points of the deformable electronic. Alternatively or in combination, the pattern of the material layer and the deposition placement of the material layer increases a radius of a curvature of the deformable electronic and decreases its chance of mechanical failure. The material layer is able to be patterned and deposited on a flexible portion of the deformable electronic and comprises an effective stiffness that decreases with distance from a rigid portion of the deformable electronic. The material layer is able to comprise a high elastic modulus. In some embodiments, the material layer comprises one or a combination of metal, polymer, cloth glass weave, polymers, and natural fibers. In some embodiments, the pattern comprises one or a combination of interlocking cones, rhomboids, circles, hexagons, and squares. The material layer is able to be photo-patterned, die-cut, laser-cut, silk-screened, and injection molded. Particularly, the strength of the deformable electronic is increased in a X dimension, a Y dimension, a Z dimension, and other dimension. In some embodiments, the material layer is attached inside or outside of the deformable electronic by bonding or lamination, or to the casing by bonding. In some embodiments, the material layer is attached to a rigid, a rigid-flex, a stretch, a rigid-stretch, or a mechanism housing of the deformable electronic. In some embodiments, the deformable electronic comprises a flexible circuit board.

In another aspect, a method of strengthening a deformable electronic comprises patterning a material layer into a specific pattern based upon one or more characteristic of the deformable electronic and depositing the material layer onto the deformable electronic, wherein the pattern of the material layer and the deposition placement of the material layer modifies the stress concentration of the deformable electronic in order to increase its overall strength. In some embodiments, the pattern of the material layer and the deposition placement of the material layer modifies the stress concentration away from the weak points of the deformable electronic. Alternatively or in combination, the pattern of the material layer and the deposition placement of the material layer increases a radius of a curvature of the deformable electronic and decreases its chance of mechanical failure. The material layer is able to be patterned and deposited on a flexible portion of the deformable electronic and comprises an effective stiffness that decreases with distance from a rigid portion of the deformable electronic. The material layer is able to comprise a high elastic modulus. In some embodiments, the material layer comprises one or a combination of metal, polymer, cloth glass weave, polymers, and natural fibers. In some embodiments, the pattern comprises one or a combination of interlocking cones, rhomboids, circles, hexagons, and squares. The material layer is able to be photo-patterned, die-cut, laser-cut, silk-screened, and injection molded. Particularly, the strength of the deformable electronic is increased in a X dimension, a Y dimension, a Z dimension, and other dimension. In some embodiments, the material layer is attached inside or outside of the deformable electronic by bonding or lamination, or to the casing by bonding. In some embodiments, the material layer is attached to a rigid, a rigid-flex, a stretch, a rigid-stretch, or a mechanism housing of the deformable electronic. In some embodiments, the deformable electronic comprises a flexible circuit board.

BRIEF DESCRIPTION OF THE DRAWINGS

Several example embodiments are described with reference to the drawings, wherein like components are provided The drawings include the following figures.

DETAILED DESCRIPTION OF THE EMBODIMENTS

Embodiments of the invention are directed to mechanical measures for strengthening a flexible circuit board or deformable electronic by manipulating the location and/or intensity of the stress concentration or to limit bending, torsion, and stretching. A material layer is patterned onto the flexible circuit board with a specific pattern and place of deposition in order to modify the stress concentration and profile of the circuit board and increase its overall strength. The material layer can be configured to modify the stress concentrations during bending away from the weak points in the assembly or to spread the stress during bending by increasing the radius of the bend curvature and therefore decreasing the chance of mechanical failure.

Reference will now be made in detail to implementations of mechanical measures for strengthening a flexible circuit board as illustrated in the accompanying drawings. The same reference indicators will be used throughout the drawings and the following detailed description to refer to the same or like parts. In the interest of clarity, not all of the routine features of the implementations described herein are shown and described. It will be appreciated that in the development of any such actual implementation, numerous implementation-specific decisions can be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1:
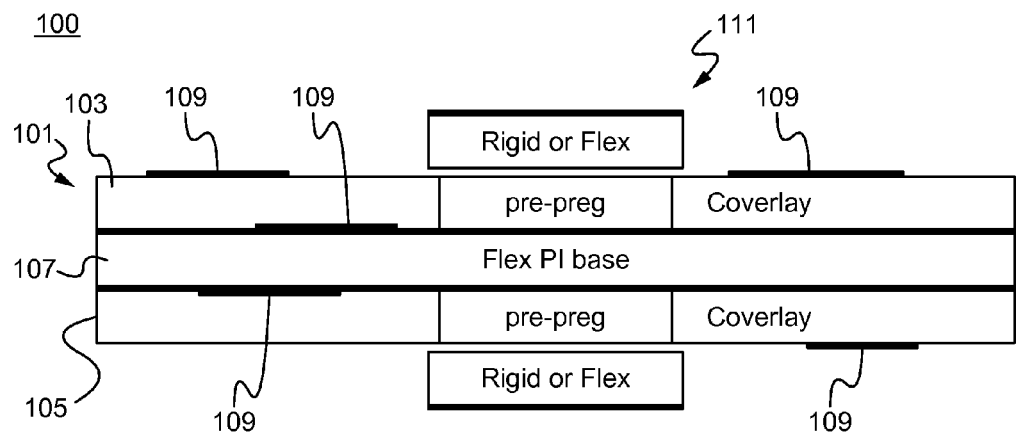
FIG. 1 illustrates a flexible circuit board in accordance with some embodiments.

Referring now to FIG. 1, a flexible circuit board is depicted therein. The flexible circuit board 100 comprises a multi-layer body 101 comprising a top cover layer 103, a bottom cover layer 105, a flexible base 107, and a center pre-preg section 111. Although the flexible circuit board 100 is shown having a top coverlay 103 and a bottom coverlay 105, the deformable electronic 100 is able to comprise more or less coverlays as appropriately desired. The center pre-preg section 111 is able to comprise a rigid or flexible section. Particularly, the deformable electronic 100 is able to comprise one or more rigid, rigid-flexible, flexible, stretchable and rigid-stretchable sections. As shown within FIG. 1, the deformable electronic 100 comprises a flexible printed circuit board. One or more material layers 109 are able to be deposited throughout the body 101 of the deformable electronic. The one or more material layers 109 modify the stress concentration and profile of the deformable electronic 100 in order to increase its overall strength and to prevent braking. In some embodiments, the one or more material layers 109 are configured to modify the stress concentrations of the deformable electronic 100 during bending away from the weak points in the assembly or to spread the stress during bending by increasing the radius of the bend curvature and therefore decreasing the chance of mechanical failure. For example, the one or more material layers 109 can be deposited and patterned on a flexible location of the deformable electronic 100 in order to obtain an effective stiffness that decreases with distance from a rigid location of the electronic 100.

The one or more material layers 109 are able to comprises one or a combination of metal, polymer, cloth weave of glass, polymers or natural fibers. The pattern of the one or more material layers 109 comprises one or a combination of interlocking cones, rhomboids, circles, hexagons, and squares. The composition, pattern and placement of the one or more material layers 109 modifies the stress concentration of the deformable electronic 100 in a specific manner in order to increase its overall strength. The one or material layers 109 are able to be photo-patterned, die-cut, laser-cut, silk-screened or injection molded. Alternatively, the one or more material layers are able to be constructed using some other conventional method as known in the art. Particularly, coupling the one or more material layers 109 with the deformable electronic 100 increases its strength in one or more of the X dimension, the Y dimension, the Z dimension, and other dimension. As shown in FIG. 1, the material layer is able to be attached inside or outside of the deformable electronic 100 by bonding or lamination, or to the electronic casing by bonding. Specifically, the one or more material layers 109 are able to be attached to the deformable electronic 100 at a specific location in order to manipulate the location and intensity of stress concentration, or to limit bending, torsion, and stretching. The one or more material layers 109 are able to be deposited on the inner layers and/or outerlayers of the deformable electronic 100. The one or more material layers 109 are able to comprise a high elastic modulus or a low elastic modulus as appropriately desired.

Figure 2:
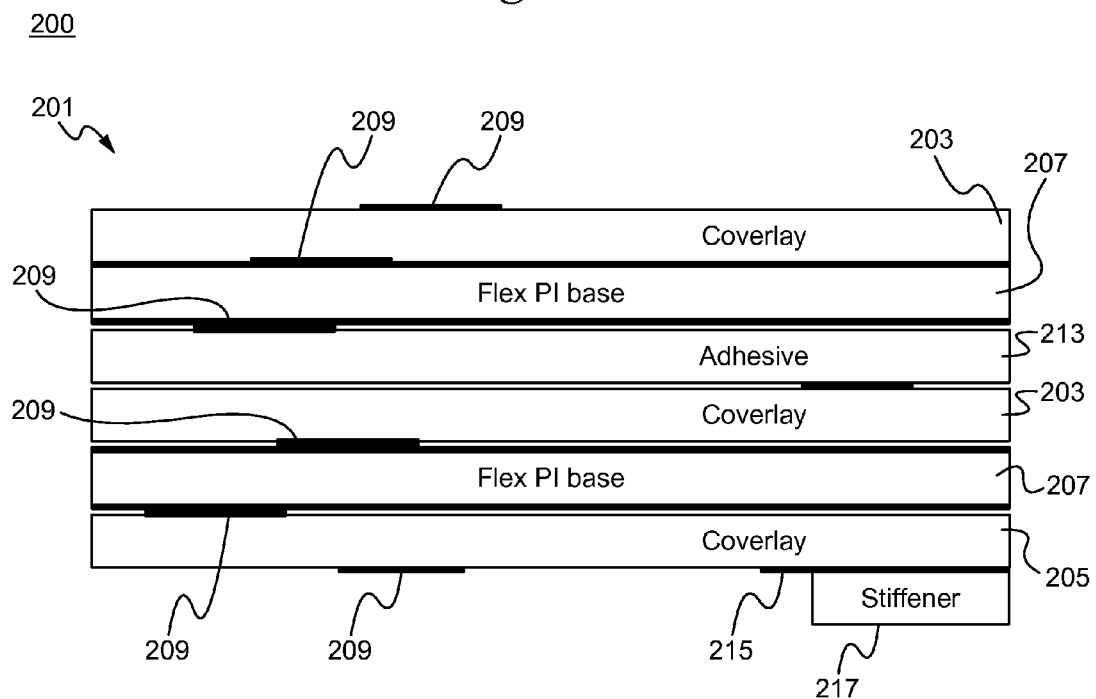
FIG. 2 illustrates a flexible circuit board in accordance with some embodiments.

FIG. 2 illustrates a deformable electronic in accordance with some embodiments. The deformable electronic 200 is similar to the deformable electronic as describe above in relation to FIG. 1. The deformable electronic 200 comprises a multi-layer body 201, a bottom coverlay 205, a plurality of top coverlays 203, a plurality of flexible bases 207, and an adhesive layer 213. Similar to as described in relation to FIG. 1, the deformable electronic 200 is able to comprise one or more rigid, rigid-flexible, flexible, stretchable and rigid-stretchable sections. As shown within FIG. 2, the deformable electronic 200 comprises a flexible printed circuit board. One or more material layers 209 are deposited throughout the multi-layer body 201 of the deformable electronic 200. As described above, the one or more material layers 209 modify the stress concentration and profile of the deformable electronic 200 in order to increase its overall strength and to prevent braking. For example, in some embodiments, the one or more material layers are configured to modify the stress concentrations during bending away from the weak points in the assembly or to spread the stress during bending by increasing the radius of the bend curvature and therefore decreasing the chance of mechanical failure.

As shown within FIG. 2, a glass cloth weave layer 215 is attached to the deformable electronic 200 at a specific location. In some embodiments, the glass cloth weave layer 215 comprises a thermoset adhesive. At the specific location, the glass cloth weave layer 215 enables the deformable electronic 200 to easily bend under pressure until the glass cloth weave layer 215 is under tension, at which point deflection of the deformable electronic 200 becomes very difficult. As also shown within FIG. 2, in some embodiments, the deformable electronic comprises one or more stiffeners 217.

The one or more material layers 209 are able to comprises one or a combination of metal, polymer, cloth weave of glass, polymers or natural fibers. The pattern of the one or more material layers 209 comprises one or a combination of interlocking cones, rhomboids, circles, hexagons, and squares. The composition, pattern and placement of the one or more material layers 209 modifies the stress concentration of the deformable electronic 200 in a specific manner in order to increase its overall strength. The one or material layers 209 are able to be photo-patterned, die-cut, laser-cut, silk-screened or injection molded. Alternatively, the one or more material layers are able to be constructed using some other conventional method as known in the art. Particularly, coupling the one or more material layers 209 with the deformable electronic 200 increases its strength in one or more of the X dimension, the Y dimension, the Z dimension, and other dimension. As shown in FIG. 2, the material layer is able to be attached inside or outside of the deformable electronic 200 by bonding or lamination, or to the electronic casing by bonding. Specifically, the one or more material layers 209 are able to be attached to the deformable electronic 200 at a specific location in order to manipulate the location and intensity of stress concentration, or to limit bending, torsion, and stretching. The one or more material layers 209 are able to be deposited on the inner layers and/or outerlayers of the deformable electronic 200.

Figure 3:
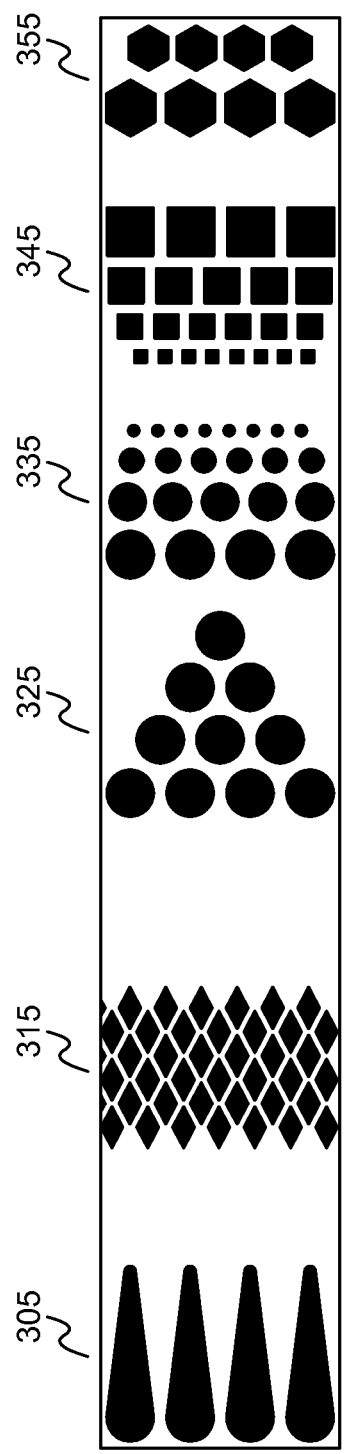
FIG. 3 illustrates one or more material layer patterns for depositing onto a deformable electronic in accordance with some embodiments.

FIG. 3 illustrates one or more material layer patterns for depositing onto a deformable electronic such as described above. The material layer is able to be patterned onto a deformable electronic such as a flexible circuit board and designed to modify stress concentrations away from weak points in the assembly or spread out the stress to increase the radius of the curvature, and therefore decrease the chance of mechanical failure. As described above, the material layer is able to be patterned into a combination of interlocking cones 305, rhomboids 315, circles 325, circles 335, squares 345, or hexagons 355. Particularly, the material layer is patterned in order to obtain the desired mechanical stiffness and increase strength in one or more of the X dimension, the Y dimension, the Z dimension, and other dimension of the deformable electronic. As described above, the material layer is able to be deposited on the inner layers and/or outerlayers of the deformable electronic 300.

Figure 4:
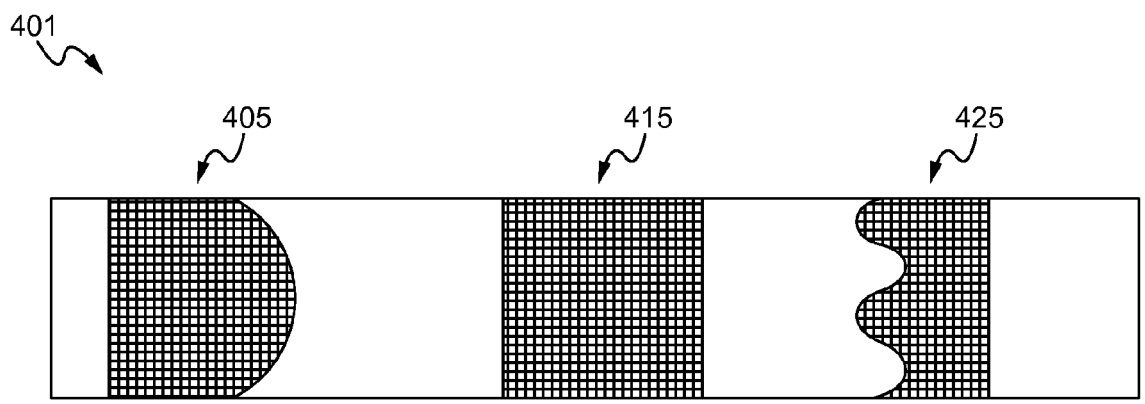
FIG. 4 illustrates one or more woven thermoset material layer patters in accordance with some embodiments.

FIG. 4 illustrates one or more material layer patterns for depositing onto a deformable electronic such as described above. As shown in FIG. 4, one or more material layers comprise a glass cloth woven material coupled to a body 401 of a deformable electronic 400. In some embodiments, the woven material layer comprises a circular pattern 405, a square pattern 415, or a wave pattern 425. The glass coven material comprises a thermoset adhesive and is attached to the deformable electronic 400 in a specific location so that the electronic 400 is able to bend easily until the glass cloth layer is under tension, at which point the deflection is very difficult. The material layer is patterned in order to obtain the desired mechanical stiffness and increase strength in one or more of the X dimension, the Y dimension, the Z dimension, and other dimension of the deformable electronic. As described above, the material layer is able to be deposited on the inner layers and/or outerlayers of the deformable electronic 400.

Figure 5:
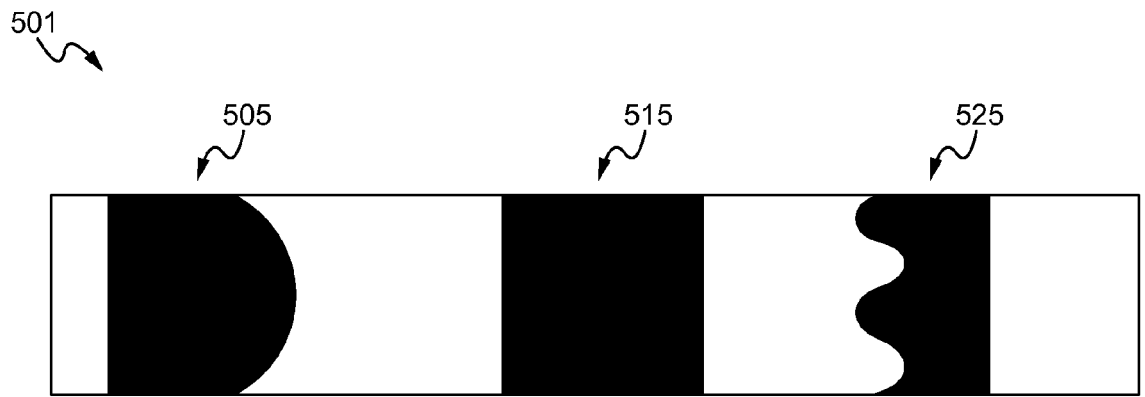
FIG. 5 illustrates one or more thermoset material layer patters in accordance with some embodiments.

As shown in FIG. 5, the one or material layers are able to comprise a high or low elastic modulus material as desired. The one or more material layers are able to comprise a circular pattern 505, a square pattern 515, a wave pattern 525 or other pattern as determined by the designed use. As described above, the one or more material layers are able to comprises one or a combination of metal, polymer, cloth weave of glass, polymers or natural fibers. The pattern of the one or more material layers comprises one or a combination of interlocking cones, rhomboids, circles, hexagons, and squares. The composition, pattern and placement of the one or more material layers modifies the stress concentration of the deformable electronic in a specific manner in order to increase its overall strength. The one or material layers are able to be photo-patterned, die-cut, laser-cut, silk-screened or injection molded. Alternatively, the one or more material layers are able to be constructed using some other conventional method as known in the art. Particularly, coupling the one or more material layers 209 with the deformable electronic increases its strength in one or more of the X dimension, the Y dimension, the Z dimension, and other dimension.

Figure 6:
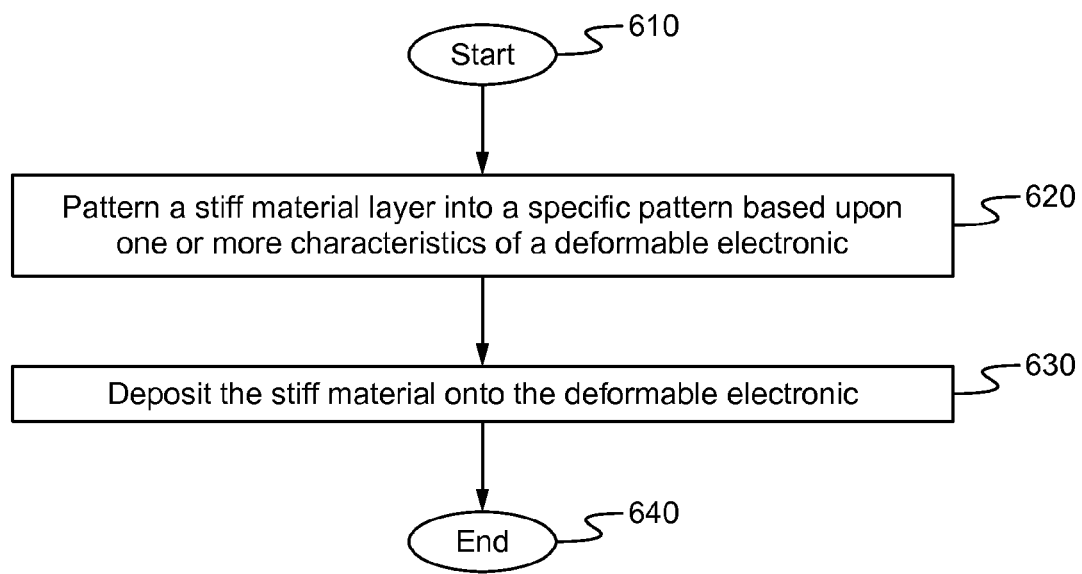
FIG. 6 illustrates a method of strengthening a flexible circuit board in accordance with some embodiments.

FIG. 6 illustrates a method of strengthening a deformable electronic such as a flexible circuit board. The method begins in the step 610. In the step 620, a material layer is patterned into a specific pattern based upon one or more characteristics of the deformable electronic. For example, the material layer is patterned with a specific pattern depending upon its place of deposition and a desired modification to the stress concentration and profile of the deformable electronic. Then, in the step 630, the material layer is deposited onto the deformable electronic. The material layer is configured to modify the stress concentrations during bending away from the weak points in the assembly or to spread the stress during bending by increasing the radius of the bend curvature and therefore decreasing the chance of mechanical failure. The method ends in the step 640.

In operation, a material layer is patterned onto a deformable electronic such as a flexible circuit board in order to manipulate the location and intensity of the stress concentration or to limit bending, torsion and stretching. The material layer is patterned with a specific pattern and deposited to a specific location on the deformable electronic in order to obtain a desired mechanical stiffness and strengthen the deformable electronic.

Specifically, a material layer is bonded inside, outside or to the casing of the deformable electronic. Particularly, the material layer is able to modify a stress curvature away from one or more weak points of the deformable electronic. Additionally, the material layer is able to spread out the stress applied to the deformable electronic as it is bent by increasing the radius of the curvature. Further, a material layer with a high or low elastic modulus is able to be tailored for the desired characteristics in order to achieve the desired stress concentrations and patterns for the deformable electronic. In this manner, patterning a material layer onto the deformable electronic decreases the chance that the deformable electronic with break while bending and mechanically fail. Accordingly, the mechanical measures for limiting stress and strain in deformable electronics as described herein has many advantages.

The present invention has been described in terms of specific embodiments incorporating details to facilitate the understanding of the principles of construction and operation of the invention. Such references, herein, to specific embodiments and details thereof are not intended to limit the scope of the claims appended hereto. It will be apparent to those skilled in the art that modifications can be made in the embodiments chosen for illustration without departing from the spirit and scope of the invention. Specifically it will be apparent to someone of ordinary skill in the art that the invention is able to be used to limit the stress and strain of any deformable electronic.

What is claimed is:

1. A deformable electronic comprising:
   a. a deformable electronic body comprising a flexible base with one or more rigid component layers and one or flexible component layers coupled to the flexible base; and
   b. one or more material layers deposited throughout the body with a material pattern comprising a combination of interlocking shapes, the one or more material layers attached at a specific location to modify the stress concentration of the deformable electronic and increase its overall strength.

2. The deformable electronic of claim 1, wherein the pattern of the one or more material layers and the placement of the one or more material layers modifies the stress concentration away from the weak points of the deformable electronic.

3. The deformable electronic of claim 1, wherein the pattern of the one or more material layers and the deposition placement of the one or more material layers increases a radius of a curvature of the deformable electronic and decreases its chance of mechanical failure.

4. The deformable electronic of claim 1, wherein the one or more material layers are patterned and deposited on a flexible portion of the deformable electronic and comprise an effective stiffness that decreases with distance from a rigid portion of the deformable electronic.

5. The deformable electronic of claim 1, wherein the one or more material layers comprise a high elastic modulus.

6. The deformable electronic of claim 1, wherein the one or more material layers comprise one or a combination of metal, polymer, cloth glass weave, polymers, and natural fibers.

7. The deformable electronic of claim 1, wherein the pattern comprises one or a combination of interlocking cones, rhomboids, circles, hexagons, and squares.

8. The deformable electronic of claim 1, wherein the one or more material layers are formed by one of photo-patterned, die-cut, laser-cut, silk-screened, or injection molded.

9. The deformable electronic of claim 1, wherein the strength of the deformable electronic is increased in one of a X dimension, a Y dimension, a Z dimension, and other dimension.

10. The deformable electronic of claim 1, wherein the one or more material layers are attached to one of inside and outside of the deformable electronic by one of bonding and lamination, and to a casing by bonding.

11. The deformable electronic of claim 1, wherein the one or more material layers are attached to one of a rigid, a rigid-flex, a stretch, a rigid-stretch, and a mechanism housing of the deformable electronic.

12. The deformable electronic of claim 11, wherein the deformable electronic comprises a flexible circuit board.

13. A method of strengthening a deformable electronic comprising:
   a. patterning one or more material layers into a pattern comprising a combination of interlocking shapes based upon one or more characteristic of the deformable electronic; and
   b. depositing one or more material layers throughout the deformable electronic, wherein the pattern of the one or more material layers and the deposition placement of the one or more material layers modifies the stress concentration of the deformable electronic in order to increase its overall strength.

14. The method of claim 13, wherein the pattern of the one or more material layers and the placement of the one or more material layers modifies the stress concentration away from the weak points of the deformable electronic.

15. The method of claim 13, wherein the pattern of the one or more material layers and the deposition placement of the one or more material layers increases a radius of a curvature of the deformable electronic and decreases its chance of mechanical failure.

16. The method of claim 13, wherein the one or more material layers are patterned and deposited on a flexible portion of the deformable electronic and comprise an effective stiffness that decreases with distance from a rigid portion of the deformable electronic.

17. The method of claim 13, wherein the one or more material layers comprise a high elastic modulus.

18. The method of claim 13, wherein the one or more material layers comprise one or a combination of metal, polymer, cloth glass weave, polymers, and natural fibers.

19. The method of claim 13, wherein the pattern comprises one or a combination of interlocking cones, rhomboids, circles, hexagons, and squares.

20. The method of claim 13, wherein the one or more material layers are formed by one of photo-patterned, die-cut, laser-cut, silk-screened, or injection molded.

21. The method of claim 13, wherein the strength of the deformable electronic is increased in one of a X dimension, a Y dimension, a Z dimension, and other dimension.

22. The method of claim 13, wherein the one or more material layers are attached to one of inside and outside of the deformable electronic by one of bonding and lamination, and to a casing by bonding.

23. The method of claim 13, wherein the one or more material layers are attached to one of a rigid, a rigid-flex, a stretch, a rigid-stretch, and a mechanism housing of the deformable electronic.

24. The method of claim 13, wherein the deformable electronic comprises a flexible circuit board.

* * * * *